United States Patent [19]

Tanaka

[11] Patent Number: 5,091,044
[45] Date of Patent: Feb. 25, 1992

[54] METHODS OF SUBSTRATE HEATING FOR VAPOR PHASE EPITAXIAL GROWTH

[75] Inventor: Toshio Tanaka, Hyogo, Japan

[73] Assignee: Mitsubishi Denki Kabushiki Kaisha, Tokyo, Japan

[21] Appl. No.: 525,009

[22] Filed: May 18, 1990

Related U.S. Application Data

[62] Division of Ser. No. 379,389, Jul. 13, 1989.

[30] Foreign Application Priority Data

Jul. 21, 1988 [JP] Japan .................................. 63-182110

[51] Int. Cl.⁵ .............................................. C30B 19/00
[52] U.S. Cl. .................................... 156/607; 156/610; 156/612; 156/613; 156/614
[58] Field of Search ................ 156/607, 610, 612, 613, 156/614, 607, 610, 612, 613, 614

[56] References Cited

U.S. PATENT DOCUMENTS

| | | | |
|---|---|---|---|
| 3,294,661 | 12/1966 | Maissel . | |
| 3,420,704 | 1/1969 | Webb | 156/610 |
| 3,480,472 | 11/1969 | Dersin et al. | 156/610 |
| 3,845,738 | 11/1974 | Berkman et al. | 118/49 |
| 4,331,707 | 5/1982 | Maruska et al. | 427/74 |
| 4,778,559 | 10/1988 | McNeilly | 156/612 |
| 4,811,687 | 3/1989 | Prince | 118/666 |

Primary Examiner—Robert Kunemund
Assistant Examiner—Felisa Garrett
Attorney, Agent, or Firm—Lowe, Price, LeBlanc & Becker

[57] ABSTRACT

An apparatus for vapor phase epitaxial growth comprises a reactor tube, a raw material gas supplying means for supplying a raw material gas or gas mixture for thin film formation into the reactor tube, a liquid tank disposed within the reactor tube, a melt stored in the liquid tank, and a heater for heating the melt. The reverse side of a substrate is kept in contact with the melt. The substrate is heated to a desired temperature by heat conduction from the melt.

7 Claims, 3 Drawing Sheets

METHODS OF SUBSTRATE HEATING FOR VAPOR PHASE EPITAXIAL GROWTH

This application is a divisional application of application Ser. No. 07/379,389, filed July 13, 1989.

BACKGROUND OF THE INVENTION

1. Field of the Invention

This invention relates to an apparatus for vapor phase epitaxial growth on the substrate surface by introducing a raw material gas or gas mixture for thin film formation onto the surface of a heated substrate, and in particular, to an apparatus for vapor phase epitaxial growth in which a grown layer uniform in film thickness can be obtained on the substrate, and to a method of substrate heating.

2. Description of the Background Art

As schematically illustrated in FIG. 6, a typical conventional apparatus for vapor phase epitaxial growth comprises a reactor tube 1 made of quartz, a holder 2 disposed within the reactor tube 1, a susceptor 3 supported by the holder 2 and a high-frequency heating coil 5. The susceptor 3 is made of, for example, carbon and is heated to a desired temperature by means of the high-frequency heating coil 5. A substrate 4 is placed on the susceptor 3 and is heated to a desired temperature by heat conduction from the susceptor 3.

For convenience of illustration, let it be supposed that a GaAs (gallium arsenide) substrate is used as the substrate 4, that a mixed gas composed of trimethylgallium (TMG) gas, trimethylaluminum (TMA) gas and arsine ($AsH_3$) gas is used as the raw material gas mixture for epitaxial growth and that hydrogen ($H_2$) gas is used as a carrier gas. It is also supposed that diethylzinc gas is used as a dopant. The GaAs substrate 4 is heated to a temperature of, for instance, about 800° C. by heat conduction from the susceptor 3. The raw material gas mixture introduced into the reactor tube 1 is thermally decomposed on the heated GaAs substrate 4 and, as a result, epitaxial growth of an AlGaAs (aluminum gallium arsenide) layer takes place on the substrate 4. Then, the supply of TMA gas is discontinued, and a mixed gas composed of TMG gas and $AsH_3$ gas is introduced into the reactor tube 1 as the raw material gas mixture, whereby epitaxial growth of a GaAs layer takes place on the AlGaAs layer on the substrate 4. Repetition such steps can result in epitaxial growth of a number of layers on the substrate 4.

Prior to epitaxial growth, the GaAs substrate 4 is, for example, mirror-finished on the face side and lapped on the reverse side. Thus, the face side and the reverse side of the substrate 4 differ in finished surface smoothness in many instances. In certain instances, the substrate 4 is subjected to patterning on the face or reverse side or already has thereon an epitaxial layer differing in thermal expansion coefficient from the substrate 4. In such instances, when heated to a temperature of about 800° C., the substrate 4 curls in a concave or convex fashion as illustrated in FIG. 7, since the face and reverse sides differ in condition. As a result, a clearance 6 is formed between substrate 4 and susceptor 3.

As mentioned above, the substrate 4 is heated to a desired temperature by the conduction of heat from the susceptor 3. When the substrate curls to give rise to a clearance 6 between substrate 4 and susceptor 3 as shown in FIG. 7, a temperature gradient or nonuniformity in the planar direction is created within substrate 4. In other words, whereas that portion of substrate 4 which is in contact with susceptor has a relatively high temperature, the portion apart from the susceptor has a relatively low temperature. A nonuniform temperature distribution on the surface of substrate 4 leads to the formation on the substrate of an epitaxially grown layer which is locally varying in thickness.

Clearances 6 are also formed between the substrate 4 and susceptor 3 when the reverse side of substrate 4 and/or the face side of the susceptor 3 is uneven, as shown in FIG. 8. In this case, too, an uneven temperature pattern results within the substrate 4 in the planar direction and the epitaxially grown layer formed on the substrate 4 becomes uneven in film thickness.

SUMMARY OF THE INVENTION

Accordingly, it is an object of the invention, which has been made to solve the above problems, to provide an apparatus for vapor phase epitaxial growth, the use of which can render the epitaxially grown layer formed on a substrate uniform in film thickness.

Another object of the invention is to provide a method of heating a substrate which obviates the formation of an uneven temperature distribution in the planar direction of the substrate.

The invention thus provides an apparatus for vapor phase epitaxial growth which comprises a reactor tube, a raw material gas supplying means for supplying a raw material gas or gas mixture for thin film formation into the reactor tube, a liquid tank disposed in the reactor tube, a melt stored in said liquid tank, and a heating means for heating said melt. A substrate is placed on the melt surface in the manner such that the reverse side of the substrate is in contact with the melt surface. When the melt is heated to a desired temperature by the heating means, the substrate is also heated to a desired temperature by heat conduction from the melt.

In another aspect thereof, the invention also provides a method of heating a substrate to a desired temperature for causing epitaxial growth on the surface of said substrate by introducing a raw material gas or gas mixture for thin film formation onto the substrate surface within the reactor tube, which method comprises disposing a liquid tank with a melt stored therein within the reactor tube, bringing the reverse side of the substrate into contact with the melt and heating the melt and thereby heating the substrate to a desired temperature by heat conduction from the melt.

In the vapor phase epitaxial growth apparatus according to the invention, the reverse side of the substrate is in contact with the melt. Since the melt has fluidity, the melt remains in uniform contact with the whole reverse side of the substrate even when the substrate has a curve form or is uneven on the reverse side. In other words, no clearance is formed between the substrate and the melt. The substrate is heated by heat conduction from the melt which is in uniform contact all over the reverse side thereof. Therefore, the heated substrate shows no temperature gradient or nonuniform temperature distribution in the planar direction and, as a result, the epitaxially grown layer formed on the substrate surface is uniform in thickness.

In carrying out the heating method according to the invention, the substrate is heated by heat conduction from the melt with which the reverse side of the substrate is in contact, since even when the substrate has a curled figure or is uneven on the reverse side, the melt can come and remain in uniform contact with the substrate, so that there occurs no temperature gradient or non-uniform temperature distribution in the planar direction.

In a preferred embodiment of the invention, the material to serve as the melt is selected from among materials having a greater specific gravity than that of the substrate material. In this way, the substrate can keep floating on the melt surface.

The substrate material is, for example, GaAs or InP (indium phosphide), and the material to serve as the melt is, for example, Ga or In. In such case, the substrate is preferably coated on the reverse side with a protective film layer of SiN or $SiO_2$, for instance, so that the possible reaction between the substrate and the melt can be prevented.

In another preferred embodiment, the material to serve as the melt is selected from among materials of the same kind as the component constituting the raw material gas or gas mixture for thin film formation. For instance, a trimethylgallium-containing raw material gas mixture for thin formation is used when Ga or In is used as the melt material. Also materials belonging to the same group in the periodic table of elements, such as Ga and In may be used. In fact, Ga and In closely resemble each other in many properties. In this embodiment, the vapor from the melt will not produce adverse effects on the epitaxial growth.

In a further preferred embodiment, the material to serve as the melt is selected from among materials inert to the substrate. As an example of such materials, there may be mentioned $B_2O_3$ (boron oxide). When $B_2O_3$ is selected as the melt, it is necessary to provide a substrate-supporting member additionally, since $B_2O_3$ has a low specific gravity. Even in such case, the substrate reverse side can remain in contact with the melt surface.

In a still preferred embodiment, the melt stored in the liquid tank is composed of a lower liquid layer having a relatively high specific gravity and an upper liquid layer having a relatively low specific gravity. In this case, the material constituting the upper liquid layer should preferably be a material inert to the substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
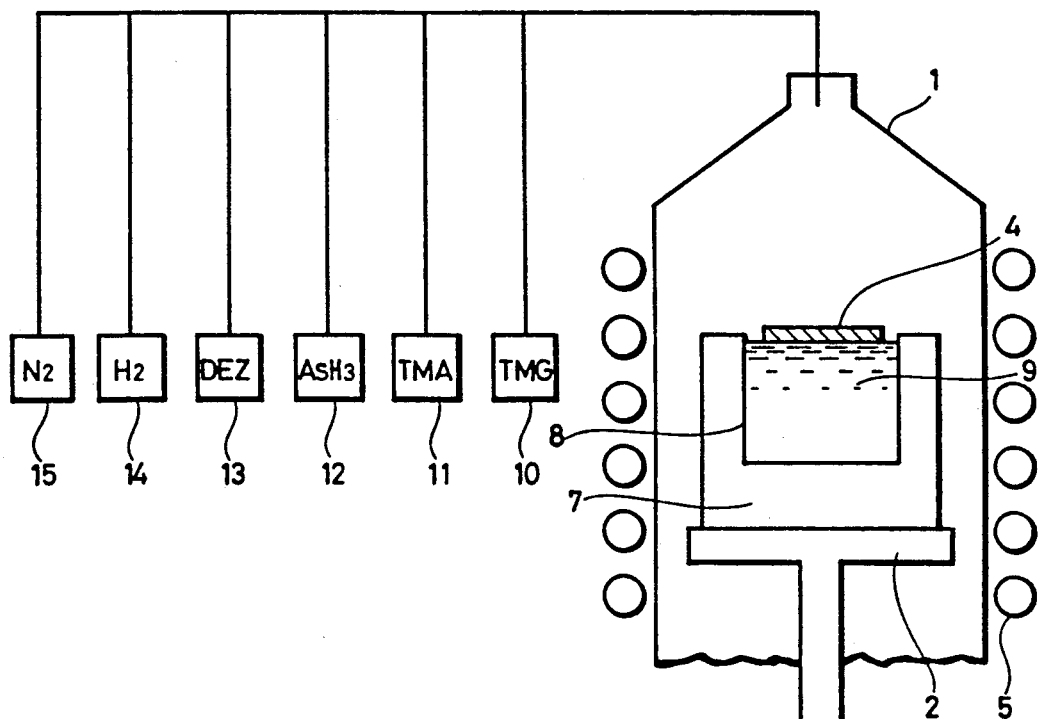
FIG. 1 is a schematic view of an example of the apparatus for vapor phase epitaxial growth according to the invention.

FIG. 1 is a schematic view of an apparatus for causing epitaxial growth on a substrate by introducing a raw material gas or gas mixture for thin film formation onto the heated substrate surface. The apparatus shown comprises a reactor tube 1, a raw material gas supplying means for supplying the raw material gas or gas mixture for thin film formation into reactor tube 1, a holder 2 disposed within the reactor tube 1, a susceptor 7 supported on holder 2, a liquid tank 8 formed within and by part of the susceptor 7, in which tank a melt 9 is stored, and a high-frequency heating coil 5 for heating melt 9.

For convenience of illustration, let it be supposed that a GaAs substrate is used as substrate 4, that Ga is used as the material to serve as melt 9, that a mixed gas composed of trymethylgallium gas (TMG gas), trimethylaluminum gas (TMA gas) and arsine gas ($AsH_3$ gas) is used as the raw material gas mixture for thin film formation, that hydrogen gas ($H_2$ gas) is used as a carrier gas, that diethylzinc (DEZ gas) is used as a dopant gas, and that nitrogen gas ($N_2$ gas) is used as a gas for replacing the atmosphere in reactor tube 1. It is also supposed that the reactor tube 1 is made of quartz and that the susceptor 7 is made of carbon.

The susceptor 7 is heated to a desired temperature by the high-frequency heating coil 5, and the melt 9 is heated to a desired temperature by heat conduction from susceptor 7. The GaAs substrate 4 is placed on the surface of melt 9 in a liquid tank 8. Since the specific gravity of the melt material Ga is higher than that of the substrate material GaAs, the GaAs substrate 4 keeps floating on the surface of melt 9 owing to the specific gravity difference.

Figure 2:
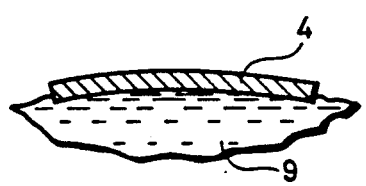
FIG. 2 is a schematic view of a substrate placed on a melt.

The GaAs substrate 4 is heated to a desired temperature by heat conduction from melt 9. Since the melt 9 has a fluidity, no clearance is formed between substrate 4 and melt 9 and the melt 9 keeps in contact with the whole reverse side of substrate 4 even when the substrate 4 curls during the epitaxial growth treatment. FIG. 2 schematically shows such a favorable state. Even when the substrate 4 is uneven on the reverse side, the melt 9 can be in uniform contact with the substrate 4 all over the reverse side thereof. Therefore, the substrate 4 heated by heat conduction from the melt 9 has a uniform temperature distribution in the planar direction with respect to the same. As a result, the epitaxially grown layer formed on the substrate 4 is uniform in film thickness.

Figure 5:
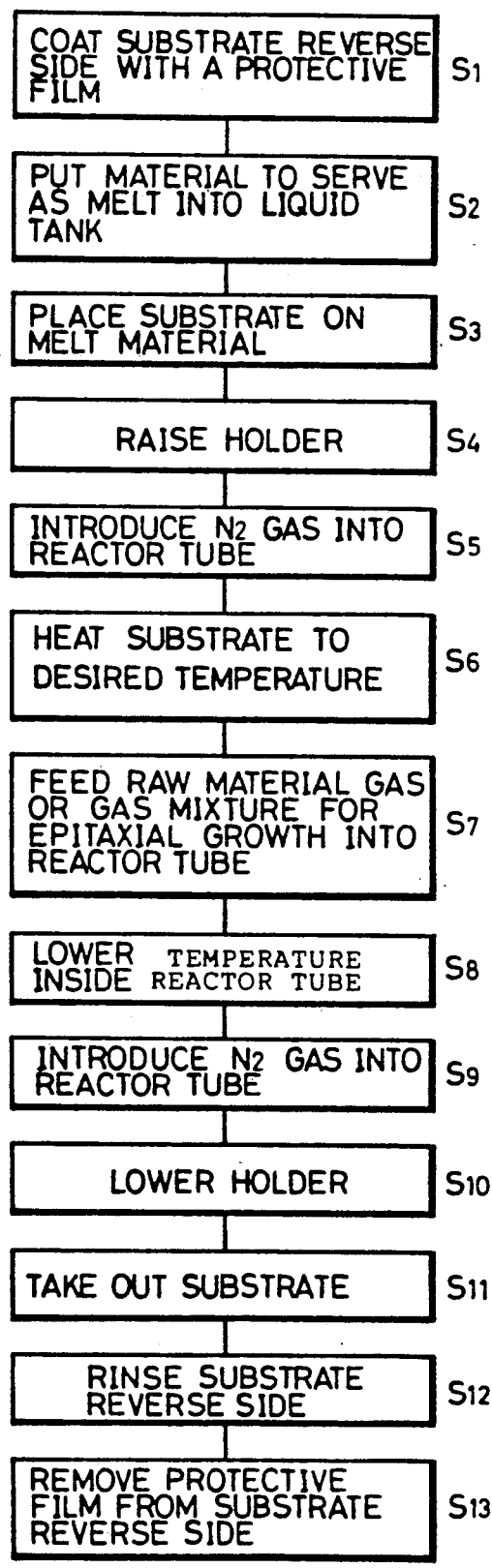
FIG. 5 is a chart illustrating the sequence of steps for epitaxial growth using the apparatus illustrated in FIG. 1.
Figure 6:
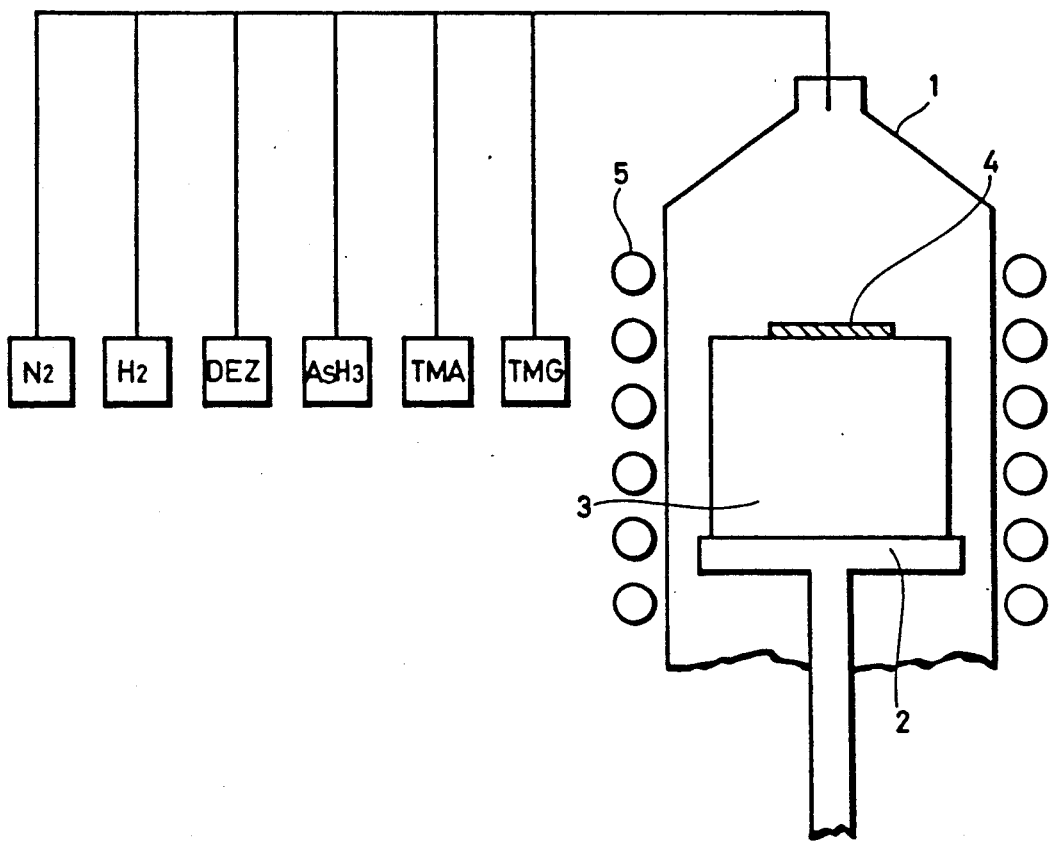
FIG. 6 is a schematic view of a conventional apparatus for vapor phase epitaxial growth.
Figure 7:
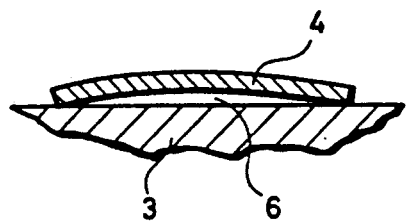
FIG. 7 is an enlarged cross-sectional view of a substrate in contact with a conventional susceptor supporting substrate from below.
Figure 8:
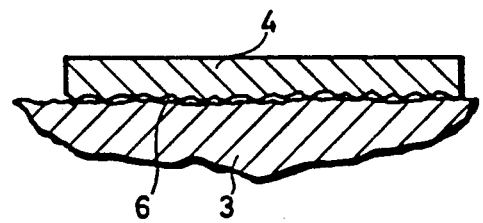
FIG. 8 is cross-sectional view of another example of the structure of the contact portion between a substrate and a conventional susceptor supporting the substrate from below.

FIG. 5 shows a series of steps for causing epitaxial growth on the GaAs substrate 4. Referring to FIGS. 1 and 5, the series of steps for forming an epitaxially grown layer on the substrate 4 is now described. For preventing the possible reaction between GaAs substrate 4 and melt 9, the reverse side of substrate 4 is coated in advance with a protective film (step S1). When GaAs is used as substrate 4 and Ga as melt 9, direct contact between the substrate 4 and the melt 9 at elevated temperature may possibly result in partial dissolution of the GaAs substrate as the result of a reaction of the GaAs substrate 4 with melt 9. For preventing such reaction or dissolution from occurring, the reverse side of the GaAs substrate 4 is coated in advance with a protective film of SiN or $SiO_2$, for instance.

The holder 2 is vertically movable and, prior to initiation of treatment, it is positioned in a position lower than that shown in FIG. 1. The susceptor 7 is placed on this holder 2, and the material (Ga) to serve as melt 9 is put into the liquid tank 8 provided in the susceptor 7 (step S2). The melting point of Ga is 29.78° C. Therefore, the Ga material is converted to a liquid state by heating to a temperature above that melting point and, in its liquid state, is poured into the liquid tank 8.

In this step, however, it is not always necessary to convert the Ga material to a liquid state; the Ga material may be put into the liquid tank 8 in a solid state.

The GaAs substrate 4 is then placed on the molten Ga material placed in the liquid tank 8 (step S3). Since the molten Ga material has a specific gravity higher than the specific gravity of the GaAs substrate material, the GaAs substrate 4 is kept floating on the surface of the metal material which is in a liquid state.

Then, the holder 2 is raised to an appropriate position (step S4).

Then, $N_2$ gas is fed from a nitrogen supply means 15 into the reactor tube 1, whereby the inside of the reactor tube is placed under an $N_2$ gas atmosphere (step S5).

An electric current is then applied to the high frequency heating coil 5 to heat the GaAs substrate 4 to a desired temperature (step S6). The desired temperature is for example, about 800° C. The susceptor 7 is heated by means of the high-frequency heating coil 5, and the melt 9 is heated by heat conduction from the susceptor 7. The substrate 4 is also heated by heat conduction from melt the 9 which is in uniform contact with the whole reverse side of the substrate 4, so that the substrate 4 shows a uniform temperature distribution in the planar direction thereof.

Then, a raw material gas mixture for epitaxial growth is introduced into the reactor tube 1 (step S7). More particularly, trimethylgallium gas (TMG gas), trimethylaluminum gas (TMA gas), arsine gas ($AsH_3$ gas), diethylzinc gas (DEZ gas) and $H_2$ gas are fed into the reactor tube 1 from a TMG gas supply means 10, a TMA gas supply means 11, an arsine supply means 12, a DEZ gas supply means 13 and a hydrogen gas supply means 14, respectively. The gas mixture composed of the TMG gas, TMA gas and $AsH_3$ gas is the raw material gas mixture, the $H_2$ gas is a carrier gas, and the DEZ gas is a dopant gas.

The TMG gas, TMA gas and $AsH_3$ gas are decomposed on the surface of the GaAs substrate 4 heated at a temperature of about 800° C. and epitaxial growth of an AlGaAs layer takes place on the surface of said substrate 4. After the epitaxial AlGaAs layer growth, the supply of TMA gas is discontinued, and a mixture of TMG gas and $AsH_3$ is fed to the reactor tube 1 as the raw material gas mixture, whereupon epitaxial growth of a GaAs layer takes place on the AlGaAs layer on the GaAs substrate 4. Repetition of these steps can result in multilayer epitaxial growth.

After completion of the desired epitaxial growth, the electricity application to high-frequency heating coil 5 is discontinued and the temperature of the atmosphere within the reactor tube 1 is lowered (step S8). On that occasion, $N_2$ gas is introduced into the reactor tube 1 and the inside of reactor tube 1 is thereby placed under an $N_2$ gas atmosphere (step S9).

When the temperature of substrate 4 has nearly approached ordinary temperature, the holder 2 is caused to descend (step S10).

Since the melting point of Ga, which is used as the material of melt 9, is 29.78° C., the Ga material for melt 9 is still a liquid state immediately after the descent of the holder 2. The GaAs substrate 4 floating on the surface of this liquid is taken up by means of forceps, for instance (step S11).

The Ga melt adhering to the reverse side of the GaAs substrate 4 is wiped off with a cloth or the like (step S12). On that occasion, the reverse side of GaAs substrate 4 may be immersed in an HCl solution (hydrochloric acid) for complete removal of the Ga melt adhering to the reverse side of substrate 4.

Finally, the protective film formed on the reverse side of substrate 4 is removed by immersing the reverse side of GaAs substrate 4 in hydrofluoric acid (step S13).

In the above example, Ga is used as the material of melt 9 for GaAs substrate 4, and the raw material gas mixture contains TMG gas. In such case, since the material of melt 9, namely Ga, is a component of TMG gas, the vapor melt 9 does not exert any adverse influence on the epitaxial growth.

It is also possible to use GaAs as the material of substrate 4, a mixed gas composed of TMG gas, TMA gas and $AsH_3$ gas as the raw material gas mixture, and In as melt 9 in lieu of Ga. Since In and Ga belong to the same group, namely group III, in the periodic table of elements, they closely resemble each other in most of their properties. Therefore, the vapor from the In melt will not adversely affect the epitaxial growth. The melting point of In is, however, considerably higher, namely 156.6° C. Therefore, in the above mentioned step S2, In is put, in the solid state, into the liquid tank 8 inside susceptor 7. When, after completion of the epitaxial growth, the substrate 4 is taken out of the reactor tube 1, the material of melt 9, namely In, is in the solid state. The solid In adhering to the reverse side of the substrate can be removed by immersing the reverse side of the substrate in an HCl solution.

While, in the above description, the dopant gas used is diethylzinc gas, $H_2se$ (selenium hydride) gas may be used in lieu of the diethylzinc gas.

As the material of susceptor 7, boron nitride, silicon nitride, carbon nitride or the like may also be used in lieu of carbon. Since a susceptor made of carbon is porous, air may possibly remain in the susceptor made of carbon even when the inside of reactor tube 1 is replaced with $N_2$ gas prior to initiation of the epitaxial growth treatment. The residual air exerts an unfavorable influence on the epitaxial growth treatment. To avoid this, the outside surface of susceptor 7 made of carbon is preferably coated with SiC.

When Ga or In is used as melt 9, quartz, which is an insulator material, can be used as the material constituting susceptor 7, for Ga or In can be heated by high frequency heating. Such quartz susceptor is not porous, so that it will not cause such troubles as encountered with the carbon susceptor.

When the susceptor 7 having the liquid tank 8 is made of a material heatable by high frequency heating, a glass melt such as $B_2O_3$ can be used as melt 9. $B_2O_3$ is inert and does not exert unfavorable influences on the epitaxial growth process. The specific gravity of $B_2O_3$ is, however, lower than that of GaAs. Therefore, the substrate 4 made of GaAs will not float on the surface of $B_2O_3$ melt 9. Accordingly, it is necessary to provide additionally a substrate supporting member for supporting the substrate 4 in a state such that the reverse side of substrate 4 alone is in contact with the surface of melt 9.

Figure 3:
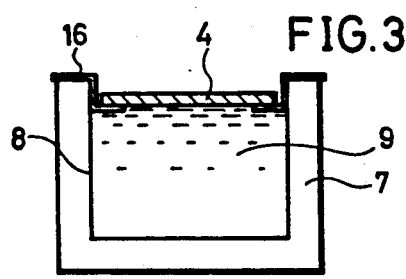
FIG. 3 is schematic view of a substrate supported by a substrate supporting member.

FIG. 3 shows an example of such member. The susceptor 7 having the liquid tank 8 is fitted, in the upper part thereof, with a substrate supporting member 16 for supporting the substrate 4 from below. In the condition shown in FIG. 3 in which the substrate 4 is supported by the substrate supporting member 16, the whole reverse side of substrate 4 is kept in uniform contact with $B_2O_3$ melt 9. As a result, the substrate 4 heated by heat conduction from melt 9 can have a uniform temperature distribution in the planar direction.

Figure 4:
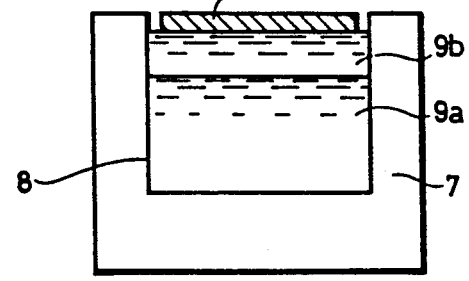
FIG. 4 is a schematic view of an example of the melt where two liquid layers are used.

FIG. 4 shows an example in which two liquid layers differing in specific gravity are used as the melt to be stored in the liquid tank 8. The melt comprises a lower liquid layer 9a having a relatively high specific gravity and an upper liquid layer 9b having a relatively low specific gravity. The material constituting the lower liquid layer 9a is a material which can be heated, for example by high frequency heating, while the material constituting the upper liquid layer 9b is preferably a material inert to the substrate 4. As an example of such inert material, there may be mentioned $B_2O_3$. The use of a melt composed of two liquid layers, as shown in FIG. 4 has the following advantages. Firstly, the lower liquid layer 9a is covered by the upper liquid layer 9b, so that vapor generation from the lower liquid layer 9b is prevented. Secondly, no consideration is required for the reactivity of the lower liquid layer 9a with the substrate 4, since the lower liquid layer 9a does not come into contact with the substrate 4. Thus the range of materials suitable as lower liquid layer 9a becomes broadened. On the other hand, $B_2O_3$ employable as the upper liquid layer 9b is inert and does not react with the substrate 4, either.

When a material which can be heated by high frequency heating is selected as the lower liquid layer 9a, quartz, which is an insulator material, can be used as the material of susceptor 7. The material constituting the upper liquid layer can be an electric insulator. Thus, for instance, Ga or In is used as lower liquid layer 9a and $B_2O_3$ is used as upper liquid layer 9b. In the case of such combination, the lower liquid layer 9a is first heated directly by high frequency heating. The upper liquid layer 9b is heated by heat conduction from the lower liquid layer 9a. The substrate 4 is heated by heat conduction from the upper liquid layer 9b.

When $B_2O_3$ is used as melt 9 for heating the substrate 4, the steps S1 and S13 shown in FIG. 5 are unnecessary. In other words, since $B_2O_3$ is inert to the GaAs substrate 4, the coating of the reverse side of substrate 4 with a protective film is unnecessary.

When $B_2O_3$ is used as melt 9, the substrate 4 taken out in the above-mentioned step S11 has, on its reverse side, solid $B_2O_3$ adhering thereto. For removing this adhering $B_2O_3$, the reverse side of substrate 4 is immersed in a hydrofluoric acid solution.

An InP substrate may be used as substrate 4 in lieu of the GaAs substrate. In that case, In, Ga or $B_2O_3$, for instance, can be used as melt 9.

Although examples of the epitaxial growth from metallic compounds on semiconductor substrates by the metallo-organic chemical vapor deposition (MOCVD) technique have been described hereinabove, the present invention has other applications. For instance, this invention is also applicable to the epitaxial growth of insulating films, such as $SiO_2$ or SiN films. Further, this invention is also applicable to the vapor phase epitaxial growth method based on a chloride process or a hydride process.

In accordance with the invention, as mentioned above, substrate heating in epitaxial growth on the substrate surface is effected by heat conduction from the melt which is in uniform contact with the whole substrate reverse side and accordingly the temperature distribution over the substrate becomes uniform in the planar direction. As a result, the epitaxial layer grown on the substrate surface becomes uniform in film thickness.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of heating a substrate to a temperature required for causing epitaxial growth on the surface of said substrate by introducing a raw material gas or gas mixture for thin film formation onto the surface of said substrate in a reactor tube, which comprises the steps of:
   disposing a liquid tank containing a melt in the reactor tube, the melt being composed of a lower liquid layer having a relatively high specific gravity and an upper liquid layer having a relatively low specific gravity,
   bringing the reverse side of said substrate into contact with said melt,
   heating said melt, and heating said substrate to said desired temperature by heat conduction from said upper liquid layer of said melt.

2. A method of heating a substrate to a temperature required for causing epitaxial growth on the surface of said substrate by introducing a raw material gas or gas mixture for thin film formation onto the surface of said substrate in a reactor tube, which comprises the steps of:
   disposing a liquid tank containing a metal in the reactor tube, coating the reverse side of said substrate with a protective film which prevents reaction between the substrate and the melt,
   bringing the coated reverse side of said substrate into contact with said melt,
   heating said melt, and heating said substrate to said desired temperature by heat conduction from said melt.

3. A method in accordance with claim 1 or 2, wherein said substrate is maintained floating on the surface of said melt.

4. A method in accordance with claim 1 or 2, wherein said substrate is maintained in a predetermined position by means of a supporting member disposed in said reactor tube.

5. A method in accordance with claim 1 or 2, wherein said melt is directly heated by a high-frequency heater.

6. A method in accordance with claim 1 or 2, wherein said melt is heated by heat conduction from said liquid tank heated by high frequency heating.

7. A method in accordance with claim 1 or 2, wherein said lower liquid layer is directly heated by a high-frequency heater and said upper liquid layer is heated by heat conduction from said lower liquid layer.

* * * * *